(12) United States Patent
Odate (10) Patent No.: US 10,678,239 B2
(45) Date of Patent: Jun. 9, 2020

(54) STEERING WHEEL, STEERING WHEEL UNIT, AND SENSOR SHEET

(71) Applicant: HONDA MOTOR CO., LTD., Minato-ku, Tokyo (JP)

(72) Inventor: Shotaro Odate, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 16/039,432

(22) Filed: Jul. 19, 2018

(65) Prior Publication Data

US 2019/0025824 A1  Jan. 24, 2019

(30) Foreign Application Priority Data

Jul. 24, 2017  (JP) .................................. 2017-142381

(51) Int. Cl.

| G01R 27/26 | (2006.01) |
| G05D 1/00 | (2006.01) |
| G01D 5/24 | (2006.01) |
| B62D 1/06 | (2006.01) |
| B62D 1/04 | (2006.01) |
| H03K 17/96 | (2006.01) |

(52) U.S. Cl.
CPC .......... *G05D 1/0061* (2013.01); *B62D 1/046* (2013.01); *B62D 1/06* (2013.01); *G01D 5/24* (2013.01); *H03K 17/962* (2013.01); *H03K 2217/96078* (2013.01)

(58) Field of Classification Search
USPC .................................................. 324/658–686
See application file for complete search history.

(56) References Cited

U.S. PATENT DOCUMENTS

| 2015/0330931 A1 | 11/2015 | Fujikawa et al. |
| 2017/0166236 A1 | 6/2017 | Iguchi et al. |
| 2018/0087929 A1* | 3/2018 | Matsumura .............. G01D 5/24 |

FOREIGN PATENT DOCUMENTS

| JP | 2015-131544 | 7/2015 |
| JP | 2015-147531 | 8/2015 |
| JP | 5816827 | 11/2015 |

* cited by examiner

*Primary Examiner* — Vincent Q Nguyen
(74) *Attorney, Agent, or Firm* — Amin, Turocy & Watson, LLP (57) ABSTRACT

On a steering wheel unit, a sensitive region for detecting contact of a human body with respect to a steering wheel is formed by arranging an electrostatic capacitance sensor on an outer circumferential portion of a rim of the steering wheel, and non-sensitive regions that do not detect contact of the human body with respect to the steering wheel are formed, respectively, on a left portion (left spoke connected part) positioned relatively to the left on the rim, and on a right portion (right spoke connected part) positioned in facing relation to the left portion via a center portion of the rim when the steering wheel is in a neutral state.

8 Claims, 7 Drawing Sheets

STEERING WHEEL, STEERING WHEEL UNIT, AND SENSOR SHEET

CROSS-REFERENCE TO RELATED APPLICATION

This application is based upon and claims the benefit of priority from Japanese Patent Application No. 2017-142381 filed on Jul. 24, 2017, the contents of which are incorporated herein by reference.

BACKGROUND OF THE INVENTION

Field of the Invention

The present invention relates to a steering wheel provided in a vehicle, a steering wheel unit adapted to detect contact by a sensor of a human body with respect to the steering wheel, and a sensor sheet made up of an electrostatic capacitance sensor affixed to the steering wheel.

Description of the Related Art

Vehicles are known which are capable of switching between manual steering performed primarily by a driver, and automated steering performed primarily by a system. In such vehicles, detection is carried out as to whether or not the driver is in contact with (or is grasping) the steering wheel at a predetermined timing, for example, at a time of returning from automated steering to manual steering. An electrostatic capacitance sensor is used for detecting contact with the steering wheel. Japanese Patent No. 5816827, Japanese Laid-Open Patent Publication No. 2015-131544, and Japanese Laid-Open Patent Publication No. 2015-147531 disclose steering wheels in which an electrostatic capacitance sensor is provided on a rim of the steering wheel.

SUMMARY OF THE INVENTION

There is a possibility, for example, that the driver may become hunched over the steering wheel due to poor physical condition or the like during automated steering. In such a situation, it can be expected that the arms or elbows of the driver may come into contact with left and right parts of the rim. When switching from an automated steering control to a manual steering control, a request is made from the vehicle with respect to the driver that the steering wheel be grasped by the driver. At this time, if an electrostatic capacitance sensor is provided on locations of the rim in contact with the arms or elbows of the driver, the electrostatic capacitance sensor detects contact of the human body with respect to the steering wheel. As a result, there is a possibility that an erroneous detection will be made that the steering wheel is being grasped, regardless of the fact that the steering wheel is not actually being grasped by the driver.

The present invention has been devised taking into consideration the aforementioned problem, and has the object of providing a steering wheel, a steering wheel unit, and a sensor sheet in which an erroneous detection that a steering wheel is being grasped is prevented.

A first aspect of the present invention is characterized by a steering wheel unit configured to detect by a sensor contact of a human body with respect to a steering wheel of a vehicle, comprising:

an electrostatic capacitance sensor provided on the steering wheel and configured to detect a magnitude of an electrostatic capacitance accompanying contact of the human body with respect to the steering wheel;

wherein, on the steering wheel unit, a sensitive region configured to detect the contact of the human body with respect to the steering wheel is formed by arranging an electrostatic capacitance sensor on an outer circumferential portion of a rim of the steering wheel; and non-sensitive regions that do not detect the contact of the human body with respect to the steering wheel are formed, respectively, on a left portion positioned relatively to left on the rim, and on a right portion positioned in facing relation to the left portion via a center portion of the rim when the steering wheel is in a neutral state.

As in the above-described configuration, when the steering wheel is in a neutral state, assuming that the non-sensitive regions are formed on the left portion positioned relatively to the left on the rim and on the right portion positioned in facing relation to the left portion, even if the arms or elbows of the driver come into contact with the left portion and the right portion of the rim, the electrostatic capacitance sensor does not detect a magnitude of the electrostatic capacitance accompanying contact of the human body with respect to the steering wheel. Therefore, it is possible to prevent an erroneous detection that the steering wheel is being grasped.

In the first aspect of the present invention, the non-sensitive regions may be further formed in a lower portion positioned relatively low on the rim when the steering wheel is in the neutral state.

When the driver restrains the steering wheel with the leg, the leg may be brought into contact with the lower portion of the rim. At this time, the electrostatic capacitance sensor detects a magnitude of the electrostatic capacitance accompanying contact of the human body with respect to the steering wheel. Upon doing so, even if the driver is not grasping the steering wheel, an erroneous detection is made that the steering wheel is being grasped. As in the above-described configuration, when the steering wheel is in a neutral state, assuming that the non-sensitive regions are formed on the lower portion positioned relatively low on the rim, even if a leg of the driver is placed in contact with the lower portion of the rim, the electrostatic capacitance sensor does not detect a magnitude of the electrostatic capacitance accompanying contact of the human body with respect to the steering wheel. Therefore, it is possible to prevent an erroneous detection that the steering wheel is being grasped.

In the first aspect of the present invention, the non-sensitive regions may be formed at connected parts between spokes of the steering wheel and the rim.

When the driver is hunched over the steering wheel due to poor physical condition or the like, there is a tendency for the driver to support his or her own weight by bringing the arms or elbows into contact with portions where the rigidity of the steering wheel is high, and more specifically, the connected parts between the spokes and the rim. As in the above-described configuration, assuming that the non-sensitive regions are formed at portions where the driver is likely to bring his or her arms or elbows into contact with the steering wheel, even if the driver is hunched over the steering wheel, the electrostatic capacitance sensor does not detect a magnitude of the electrostatic capacitance accompanying contact of the human body with respect to the steering wheel. Therefore, it is possible to prevent an erroneous detection that the steering wheel is being grasped.

In the first aspect of the present invention, the electrostatic capacitance sensor may be in form of a sheet, and is affixed to the rim.

In accordance with the above-described configuration, manufacturing costs are reduced, since the sensitive region and the non-sensitive regions can be formed with respect to the rim with a simple configuration, and by an easy operation of merely affixing the sensor sheet thereon.

In the first aspect of the present invention, the electrostatic capacitance sensor may be disposed on an outer edge portion of the rim on which the non-sensitive regions are formed.

As in the above-described configuration, assuming that the electrostatic capacitance sensor is arranged on the outer edge portion of the rim on which the non-sensitive regions are formed, by the driver properly grasping the rim, it is possible to detect that the steering wheel is being grasped. In this manner, it is possible to correctly detect a grasped state of the steering wheel.

In the first aspect of the present invention, the vehicle is configured to be switched between a manual steering mode and an automated steering mode, and the steering wheel unit may further comprise:

a contact detecting unit configured to detect whether or not the human body is in contact with the steering wheel in accordance with the magnitude of the electrostatic capacitance detected by the electrostatic capacitance sensor;

wherein the contact detecting unit may be configured to:

at a time of the manual steering mode, detect whether or not the human body is in contact with the steering wheel based on whether or not the magnitude of the electrostatic capacitance detected by the electrostatic capacitance sensor is greater than or equal to a first threshold value; and at a time of returning from the automated steering mode to the manual steering mode, set a second threshold value which is greater than the first threshold value, and detect whether or not the human body is in contact with the steering wheel based on whether or not the magnitude of the electrostatic capacitance detected by the electrostatic capacitance sensor is greater than or equal to the second threshold value.

In a vehicle that is capable of switching between a manual steering mode and an automated steering mode, at a time of returning from the automated steering mode to the manual steering mode, a request is made to the driver to grasp the steering wheel. As in the above described configuration, at a time of returning from the automated steering mode to the manual steering mode, if it is detected whether or not the human body is in contact with the steering wheel by way of a comparison with the second threshold value which is greater than the first threshold value, the accuracy in recognizing such grasping is improved.

In the first aspect of the present invention, the rim may comprise a plurality of spoke connected parts connected to the spokes, and spoke non-connected parts interposed between mutually adjacent ones of the spoke connected parts, and which are not connected to the spokes;

an electrostatic capacitance sensor may be disposed on an outer circumferential portion of the rim along a cross-sectional circumferential direction of the rim; and a width in the cross-sectional circumferential direction of the electrostatic capacitance sensor disposed at the spoke connected parts may be narrower than a width in the cross-sectional circumferential direction of the electrostatic capacitance sensor disposed at the spoke non-connected parts.

In the first aspect of the present invention, the electrostatic capacitance sensor may include:

a first portion extending from a center toward two end parts in a longitudinal direction of the sheet;

a second portion extending from one of the end parts toward the center;

a third portion extending from another of the end parts toward the center;

a fourth portion disposed between the first portion and the second portion, and a fifth portion disposed between the first portion and the third portion;

wherein the first portion, the second portion, and the third portion have a first width in a lateral direction of the sheet;

the fourth portion and the fifth portion have a second width in the lateral direction of the sheet; and the second width may be narrower than the first width.

A second aspect of the present invention is characterized by a steering wheel equipped with a rim and spokes, wherein:

the rim comprises a plurality of spoke connected parts connected to the spokes, and spoke non-connected parts interposed between mutually adjacent ones of the spoke connected parts, and which are not connected to the spokes;

an electrostatic capacitance sensor is disposed on an outer circumferential portion of the rim along a cross-sectional circumferential direction of the rim; and a width in the cross-sectional circumferential direction of the electrostatic capacitance sensor disposed at the spoke connected parts is narrower than a width in the cross-sectional circumferential direction of the electrostatic capacitance sensor disposed at the spoke non-connected parts.

As in the above-described configuration, assuming that the width of the electrostatic capacitance sensor disposed at portions where there is a high possibility that the driver will bring the arms or elbows into contact therewith is narrower than the width of the electrostatic capacitance sensor disposed at other portions, even if the driver is hunched over the steering wheel, the electrostatic capacitance sensor does not detect an electrostatic capacitance accompanying contact of the human body with respect to the steering wheel. Therefore, it is possible to prevent an erroneous detection that the steering wheel is being grasped.

A third aspect of the present invention is characterized by a sensor sheet made up from a conductive member, and affixed to a rim of a steering wheel to thereby form an electrostatic capacitance sensor, the sensor sheet comprising:

a first portion extending from a center toward two end parts in a longitudinal direction of the sheet;

a second portion extending from one of the end parts toward the center;

a third portion extending from another of the end parts toward the center;

a fourth portion disposed between the first portion and the second portion, and a fifth portion disposed between the first portion and the third portion;

wherein the first portion, the second portion, and the third portion have a first width in a lateral direction of the sheet;

the fourth portion and the fifth portion have a second width in the lateral direction of the sheet; and the second width is narrower than the first width.

In accordance with the above-described configuration, manufacturing costs are reduced, since the sensitive region and the non-sensitive regions can be formed with respect to the rim with a simple configuration, and by an easy operation of merely affixing the sensor sheet thereon.

According to the present invention, it is possible to prevent an erroneous detection that the steering wheel is being grasped.

The above and other objects, features, and advantages of the present invention will become more apparent from the following description when taken in conjunction with the accompanying drawings, in which preferred embodiments of the present invention are shown by way of illustrative example.

DESCRIPTION OF THE PREFERRED EMBODIMENTS

Preferred embodiments of a steering wheel, a steering wheel unit, and a sensor sheet according to the present invention will be presented and described in detail below with reference to the accompanying drawings.

1. Configuration of Vehicle 10

Figure 1:
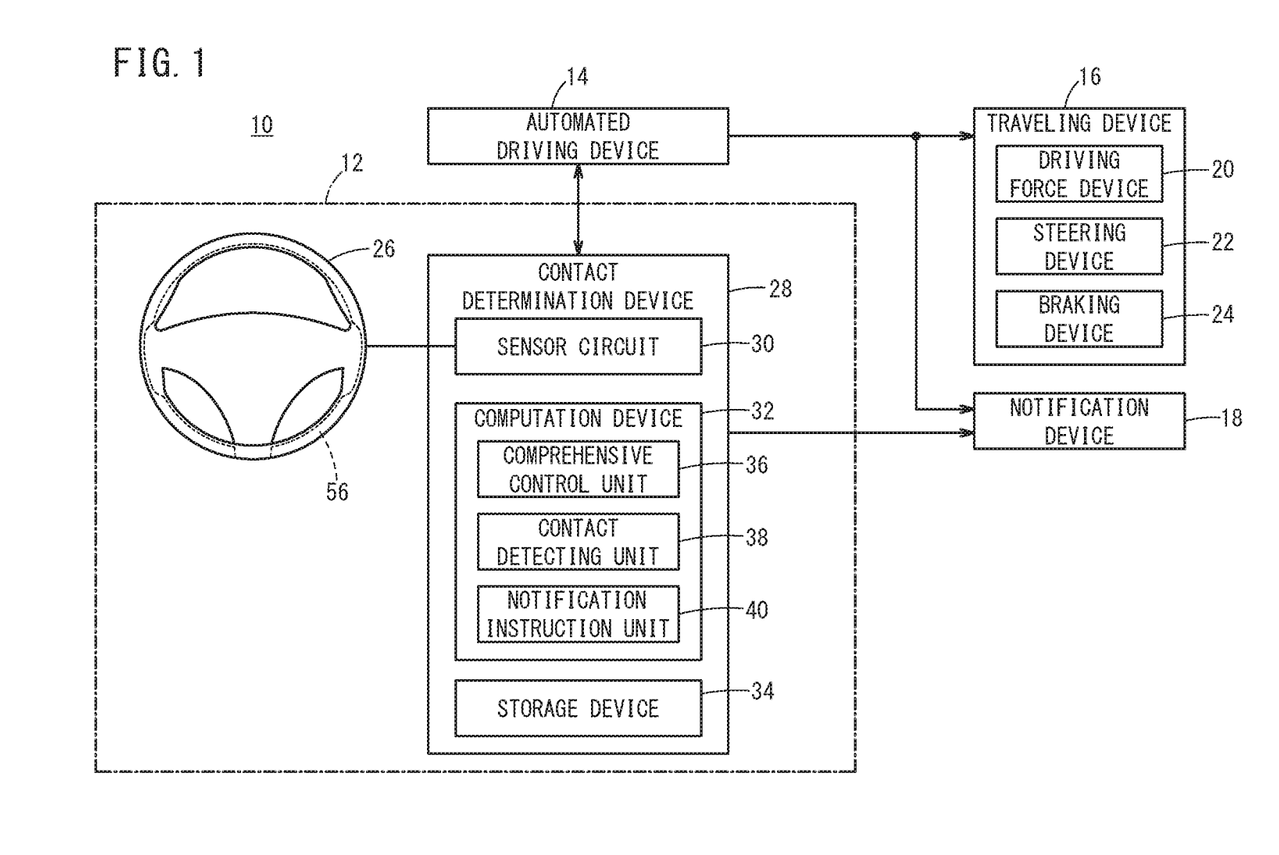
FIG. 1 is a configuration diagram of a vehicle equipped with a steering wheel unit according to an embodiment of the present invention.

As shown in FIG. 1, a steering wheel unit 12 according to a present embodiment is provided in a vehicle 10. The vehicle 10 is capable of switching between a manual steering mode in which steering is primarily performed by a driver, and an automated steering mode in which steering is primarily performed by a system (an automated driving device 14). In the present embodiment, it is assumed that the vehicle 10 is an automatically driven vehicle which, in addition to steering, is capable of performing driving and braking operations primarily by the system. The vehicle 10 includes, in addition to the steering wheel unit 12, an automated driving device 14, a traveling device 16, and a notification device 18.

The automated driving device 14 is constituted by an ECU, and comprises a computation device such as a processor or the like, and a storage device including a ROM and a RAM, etc. The automated driving device 14 realizes various functions by the computation device executing programs stored in the storage device. The automated driving device 14 acquires information necessary for automated driving, such as external environmental information (detection results of cameras, radar devices, etc.), traveling state information (traveling velocity, acceleration/deceleration) of the vehicle 10, and navigation information and the like from various sensors and devices, and outputs control instructions for automated driving, steering, and braking operations to the traveling device 16.

In the traveling device 16, there are included a driving force device 20, a steering device 22, and a braking device 24. The driving force device 20 includes a driving force ECU, and a drive source including an engine and/or a driving motor. The driving force device 20 generates a driving force in accordance with an operation of an accelerator pedal performed by the driver, or a driving control instruction output from the automated driving device 14. The steering device 22 includes an electric power steering system (EPS) ECU, and an EPS actuator. The steering device 22 generates a steering force in accordance with an operation of the steering wheel 26 performed by the driver, or a steering control instruction output from the automated driving device 14. The braking device 24 includes a brake ECU and a brake actuator. The braking device 24 generates a braking force in accordance with an operation of the brake pedal performed by the driver, or a braking control instruction output from the automated driving device 14.

The notification device 18 includes a notification ECU, a display device, an acoustic device, and a haptic device. The notification device 18 issues notifications to the driver in accordance with notification instructions output from the automated driving device 14 or a later-described contact determination device 28.

2. Configuration of Steering Wheel Unit 12

The steering wheel unit 12 includes a steering wheel 26 and the contact determination device 28.

The contact determination device 28 is constituted by an ECU, and comprises a sensor circuit 30, a computation device 32 such as a processor or the like, and a storage device 34 including a ROM and a RAM, etc.

The sensor circuit 30 is electrically connected to an electrostatic capacitance sensor 56 provided in the steering wheel 26. The sensor circuit 30 comprises a power source for energizing the electrostatic capacitance sensor 56, a measuring device (for example, a current sensor or the like) for measuring a detection value C corresponding to a magnitude of the electrostatic capacitance detected by the electrostatic capacitance sensor 56, and a switch for switching the current supplied to the electrostatic capacitance sensor 56 on and off.

The computation device 32 realizes various functions by executing programs stored in the storage device 34. In the present embodiment, the computation device 32 functions as a comprehensive control unit 36, a contact detecting unit 38, and a notification instruction unit 40. The comprehensive control unit 36 performs processes except for ones performed by the contact detection unit 38 and the notification instruction unit 40 in relation to a contact detecting process of the human body with respect to the steering wheel 26. The contact detection unit 38 detects whether or not the human body is in contact with the steering wheel 26 in accordance with the detection value C in the measurement device of the sensor circuit 30. In the event that the contact detection unit 38 does not detect contact of the human body (driver) with respect to the steering wheel 26 at a timing during which the driver is required to grasp the steering wheel 26, the notification instruction unit 40 outputs a notification instruction to the notification device 18.

In addition to the various programs, the storage device 34 stores a first threshold value and a second threshold value (which is greater than the first threshold value) as determination thresholds as to whether or not the human body is in contact with the steering wheel 26.

3. Configuration of Steering Wheel 26

Figure 2:
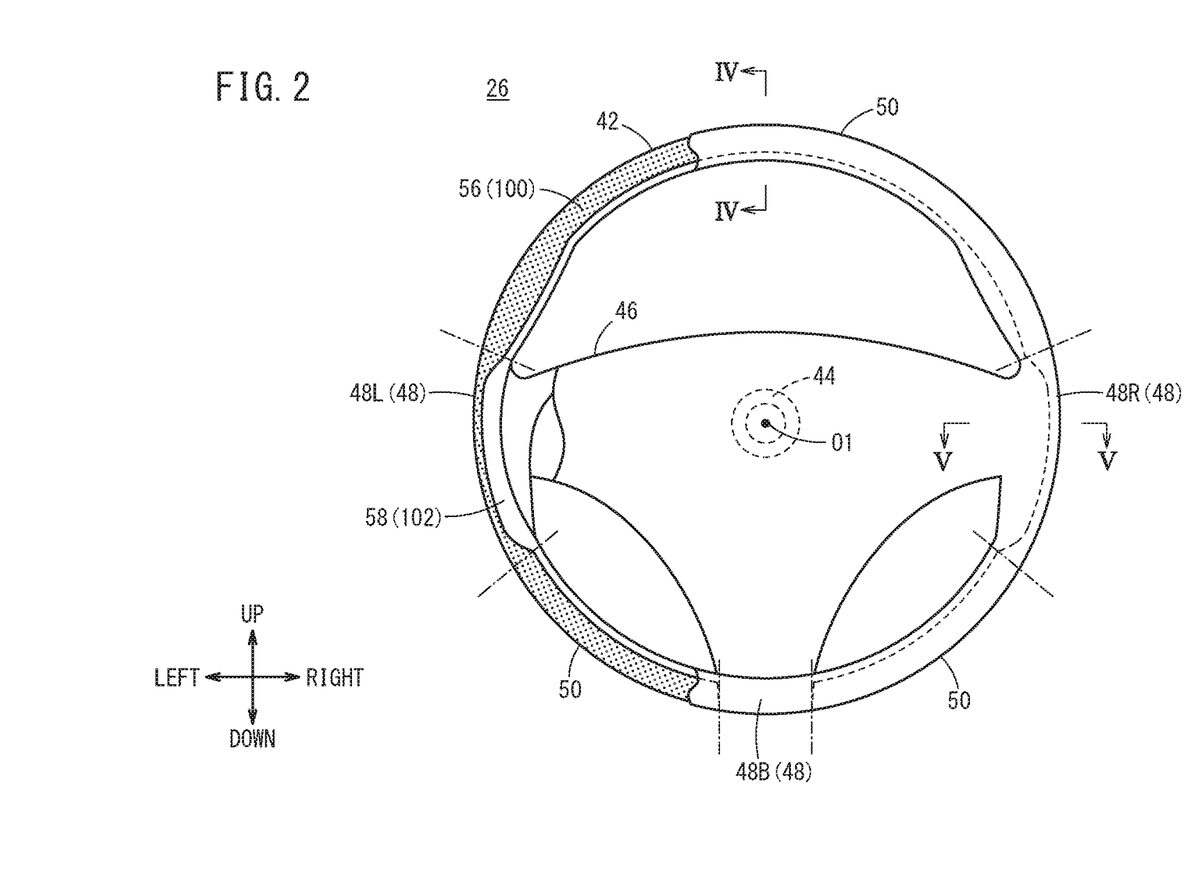
FIG. 2 is a front view of a steering wheel according to the present embodiment.
Figure 3:
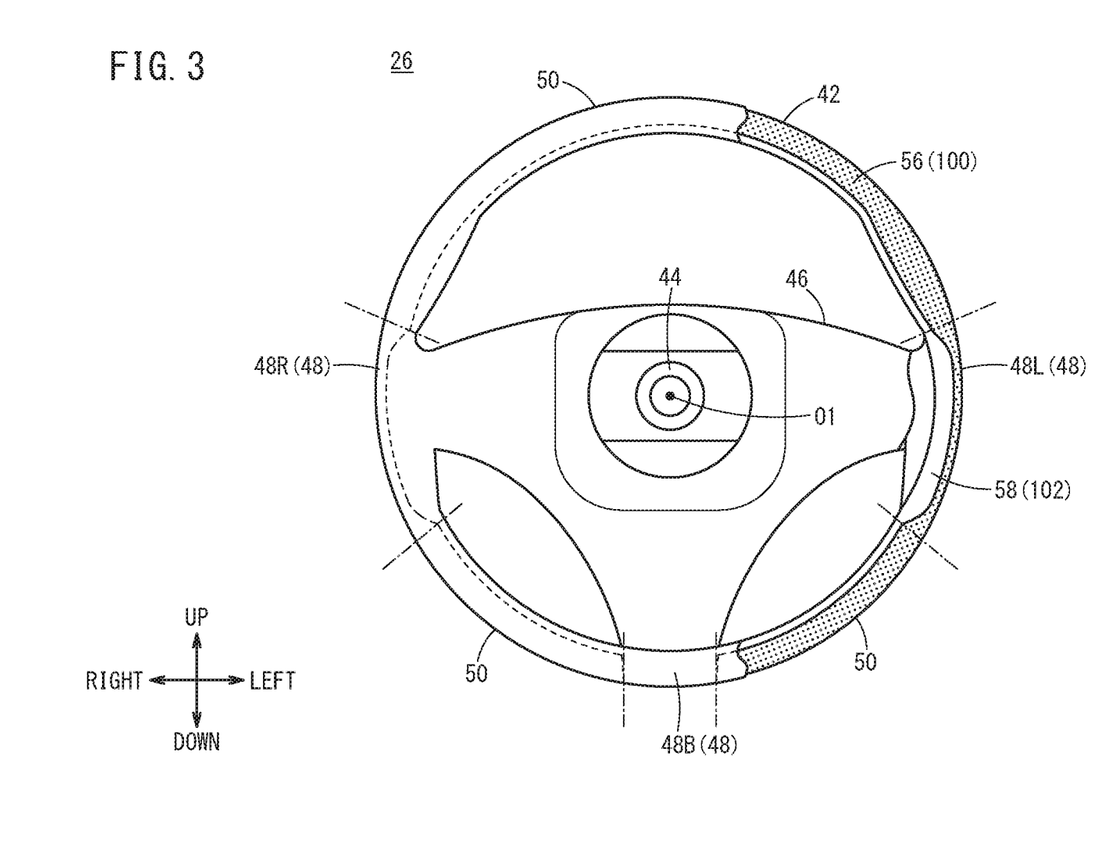
FIG. 3 is a rear view of the steering wheel according to the present embodiment.

A front view and a rear view of the steering wheel 26, as shown in FIGS. 2 and 3, illustrate an operative state (posture) of the steering wheel 26 when the vehicle 10 is traveling straight forward. Hereinafter, such an operative state (posture) will be referred to as a neutral state. In FIG. 2, an up-and-down vertical direction of the sheet is an up-and-down vertical direction of the steering wheel 26 in the neutral state, and a left-right direction of the sheet is a left-right direction of the steering wheel 26 in the neutral state. Further, a frontward direction of the sheet is a frontward direction of the steering wheel 26 in the neutral state, and a rearward direction of the sheet is a rearward direction of the steering wheel 26 in the neutral state. In FIG. 3, the front and rear and left and right directions are opposite to those shown in FIG. 2. Moreover, in FIGS. 2 and 3, in order to facilitate understanding of an electrode arrangement, which is one of the features of the present invention, a condition is shown in which a rim leather cover 60 is removed substantially from a left half side of a rim 42. The configuration of the rim 42 of the steering wheel 26 is the same on both left and right sides thereof.

As shown in FIGS. 2 and 3, the steering wheel 26 includes the annular rim 42, a hub 44 connected to a non-illustrated steering shaft, and spokes 46 interposed between the rim 42 and the hub 44. The steering wheel 26 of the present embodiment has three spokes 46 extending from the hub 44 toward the rim 42, in left and right directions and in a downward direction. It should be noted that the number of spokes 46 may be other than three, and the directions in which the spokes 46 extend need not necessarily be in the left and right directions and the downward direction.

The rim 42 is made up from three spoke connected parts 48 connected to the spokes 46, and spoke non-connected parts 50 interposed between adjacent ones of the spoke connected parts 48, and which are not connected to the spokes 46. In FIGS. 2 and 3, boundaries between the spoke connected parts 48 and the spoke non-connected parts 50 are indicated by the one-dot dashed lines. The spoke connected part 48 located on a left portion of the rim 42 in the neutral state is referred to as a left spoke connected part 48L, the spoke connected part 48 located on a right portion of the rim 42 is referred to as a right spoke connected part 48R, and the spoke connected part 48 located on a bottom portion of the rim 42 is referred to as a bottom spoke connected part 48B. The rigidity of the spoke connected parts 48 is higher than the rigidity of the spoke non-connected parts 50.

Figure 4:
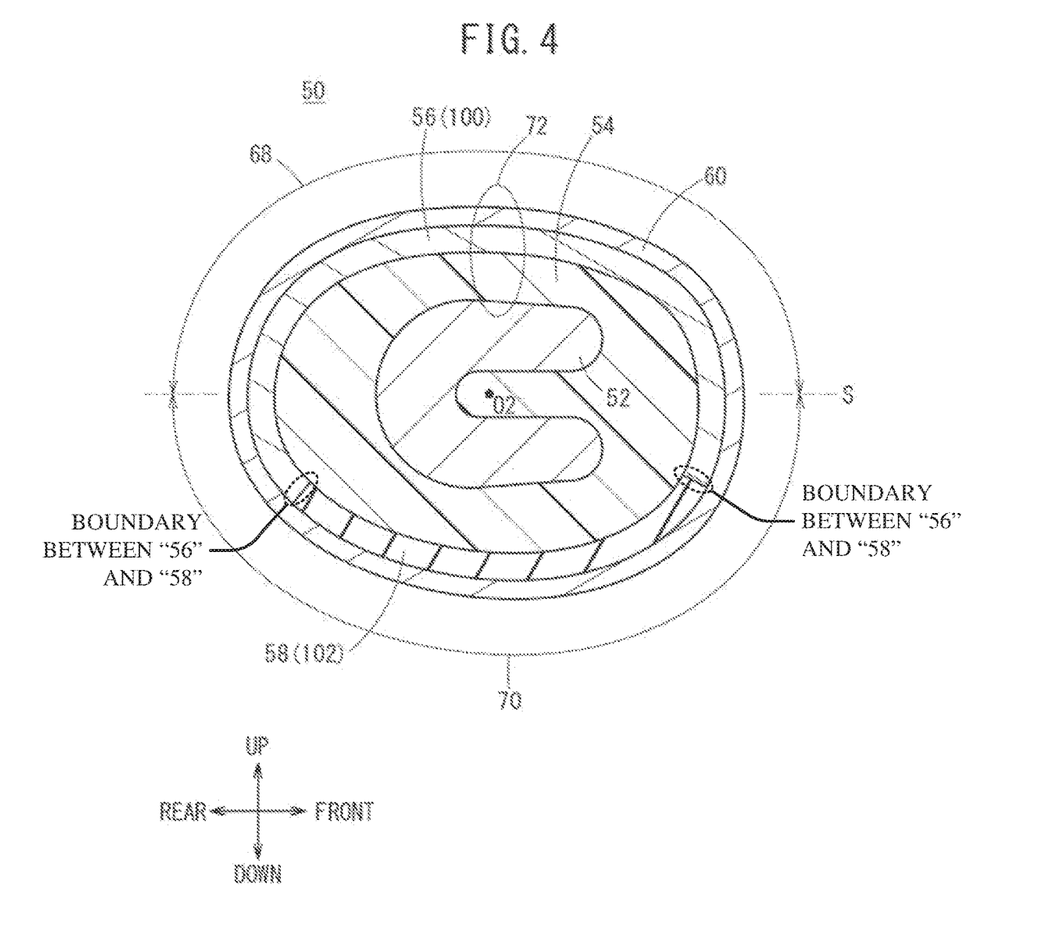
FIG. 4 is a cross-sectional view taken along line IV-IV of the steering wheel shown in FIG. 2.

The rim 42 is of a laminated structure in which a cross section thereof (cross section parallel to a central axis of the steering wheel 26) is composed of a plurality of layers. As shown in FIG. 4, in the spoke non-connected parts 50, a rim metal core 52 corresponding to a skeletal structure is covered entirely with a rim resin 54, a portion of the rim resin 54 is covered with the electrostatic capacitance sensor 56, a remaining portion of the rim resin 54 is covered by an elastic member 58, and the electrostatic capacitance sensor 56 and the elastic member 58 are covered by the rim leather cover 60. The electrostatic capacitance sensor 56 corresponds to an electrode made up from a conductive member, and is insulated from the surrounding members. The electrostatic capacitance sensor 56 and the elastic member 58 have substantially the same thickness.

Figure 5:
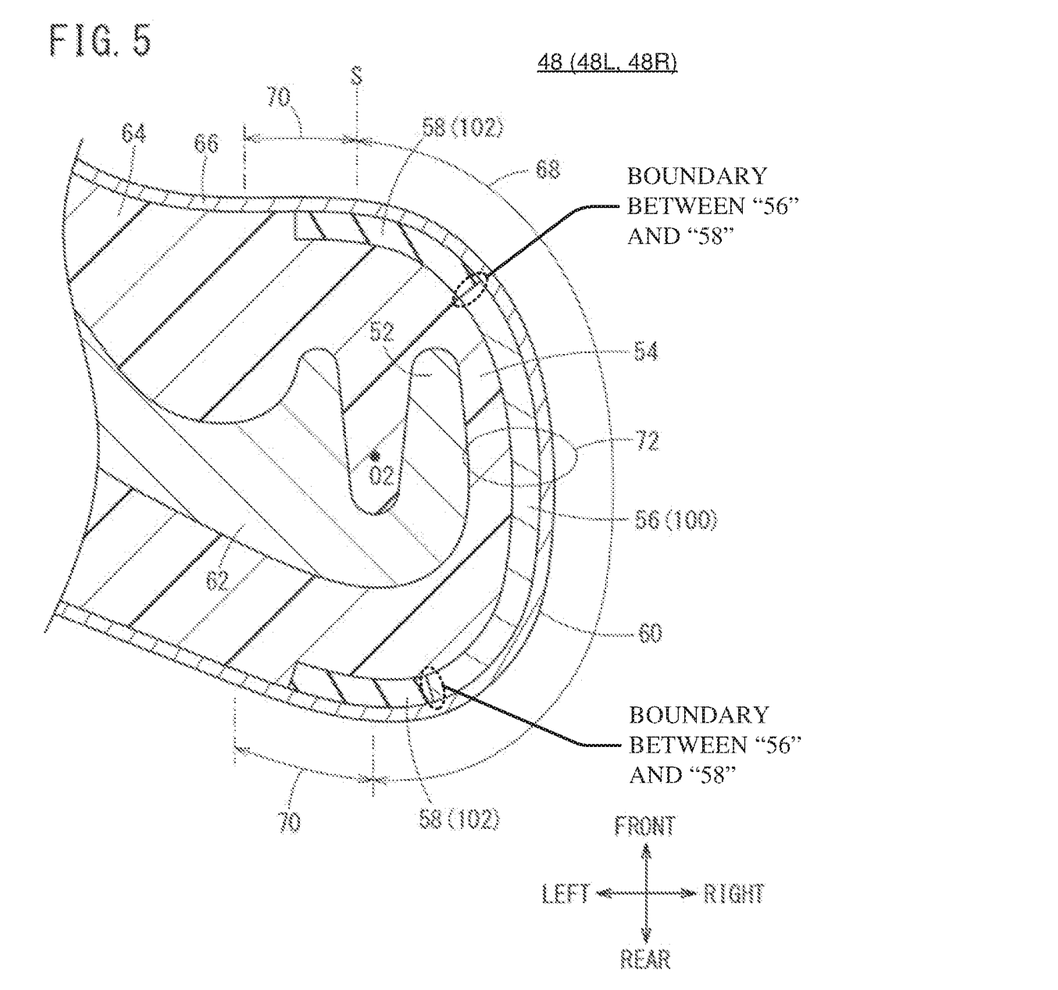
FIG. 5 is a cross-sectional view taken along line V-V of the steering wheel shown in FIG. 2.

As shown in FIG. 5, the right spoke connected part 48R and the left spoke connected part 48L (hereinafter referred to as the right spoke connected part 48R and the like), in the same manner as the spoke non-connected parts 50, include the rim metal core 52, the rim resin 54, the electrostatic capacitance sensor 56, the elastic member 58, and the rim leather cover 60. In the right spoke connected part 48R and the like, the rim metal core 52 is connected to a spoke metal core 62, the rim resin 54 is connected to a spoke resin 64, the rim leather cover 60 is connected to a spoke leather cover 66, and the elastic member 58 is disposed on portions of a front side and a rear side. The structure of the bottom spoke connected part 48B is not shown in cross section, but generally is the same as the structure of the right spoke connected part 48R and the like, except that it does not have the electrostatic capacitance sensor 56.

As shown in FIGS. 4 and 5, a portion located on the outer circumferential side of the rim 42 forming a boundary with the surface S that extends from a center portion O2 of the cross section of the rim 42 in the front-rear direction (the front direction and the rear direction) is referred to as an outer circumferential portion 68, and a portion located on the inner circumferential side of the rim 42 is referred to as an inner circumferential portion 70. Further, a portion located at the outermost periphery in each of the members is referred to as an outer edge portion 72.

As shown in FIG. 4, in the spoke non-connected parts 50, the electrostatic capacitance sensor 56 is formed on the outer circumferential portion 68 of the rim 42 and on a part of the inner circumferential portion 70. The electrostatic capacitance sensor 56 expands centrally about the outer edge portion 72 of the rim resin 54 along the cross-sectional circumferential direction of the rim resin 54, and covers the surface of the outer circumferential portion 68 and a part of the inner circumferential portion 70 of the rim resin 54. More specifically, on the spoke non-connected parts 50, the electrostatic capacitance sensor 56 covers the entire surface of the rim resin 54 on the outer circumferential side from the surface S, and a partial surface of the rim resin 54 on the inner circumferential side from the surface S.

As shown in FIG. 5, on the right spoke connected part 48R and the like, the electrostatic capacitance sensor 56 is formed on a part of the outer circumferential portion 68 of the rim 42. The electrostatic capacitance sensor 56 expands centrally about the outer edge portion 72 of the rim resin 54 along the cross-sectional circumferential direction of the rim resin 54, and covers a part of the outer circumferential portion 68 of the rim resin 54. More specifically, on the right spoke connected part 48R and the like, the electrostatic capacitance sensor 56 covers only a portion of the surface of the rim resin 54 on the outer circumferential side from the surface S, and does not cover the surface of the rim resin 54 on the inner circumferential side from the surface S.

Figure 6:
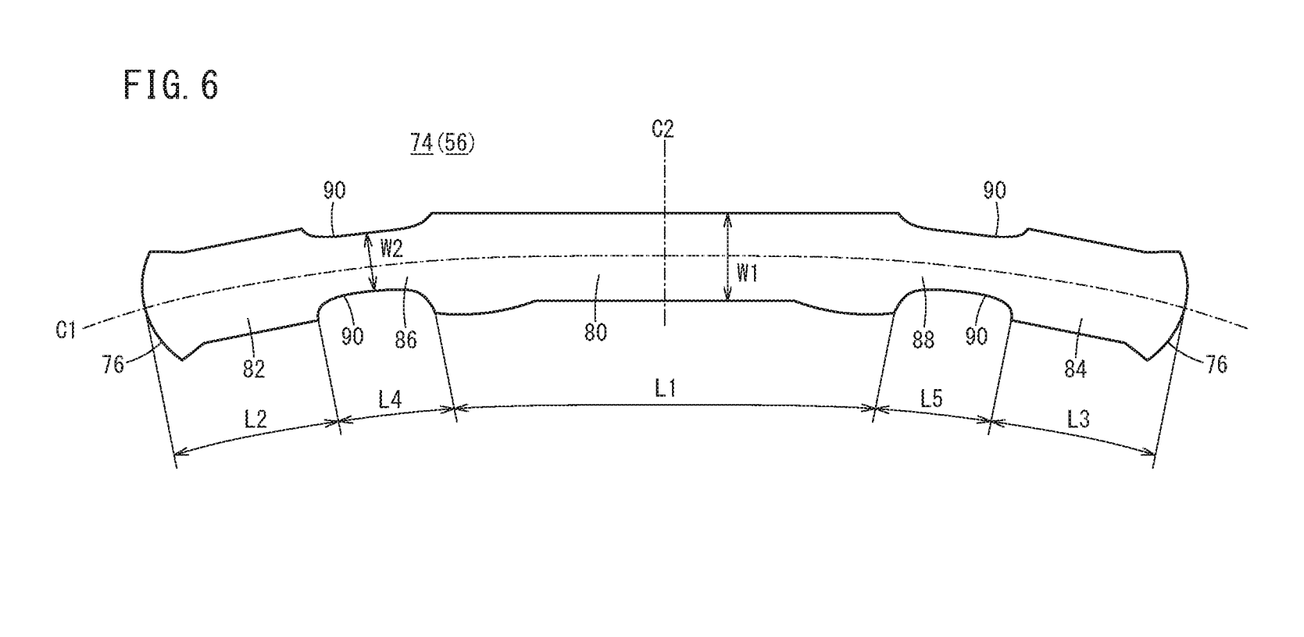
FIG. 6 is a development view of a sensor sheet.

A second width W2 in a cross-sectional circumferential direction of the electrostatic capacitance sensor 56 provided on the spoke connected parts 48 is narrower than a first width W1 in the cross-sectional circumferential direction of the electrostatic capacitance sensor 56 provided on the spoke non-connected parts 50 (see FIG. 6).

The location where the electrostatic capacitance sensor 56 is arranged on the rim 42 serves as a sensitive region 100 that detects contact of the human body with respect to the steering wheel 26. Further, the locations where the electrostatic capacitance sensor 56 is not arranged on the rim 42 serve as non-sensitive regions 102 that do not detect contact of the human body with respect to the steering wheel 26.

As shown in FIGS. 2 to 5, when the steering wheel 26 is in the neutral state, the sensitive region 100 is formed on the outer circumferential side of the rim 42, with the exception of the bottom spoke connected part 48B which is positioned relatively low on the rim 42. On the other hand, when the steering wheel 26 is in the neutral state, the non-sensitive regions 102 are formed on the left part, and more specifically, the left spoke connected part 48L positioned relatively to the left on the rim 42, and on the right part, and more specifically, the right spoke connected part 48R positioned in facing relation to the left part via a center portion O1 on the front surface in the center of the rim 42.

In the present embodiment, in the spoke non-connected parts 50, the sensitive region 100 is formed on the outer circumferential portion 68 and on a part of the inner circumferential portion 70, whereas in the right spoke connected part 48R and the like, the non-sensitive regions 102 are formed on the inner circumferential portion 70 and on a part of the outer circumferential portion 68. Stated otherwise, according to the present embodiment, a region directly in front on the spoke non-connected parts 50 is the sensitive region 100, whereas regions directly in front on the right spoke connected part 48R and the like are the non-sensitive regions 102.

In the present embodiment, the left part includes a leftmost part in the neutral state. In this instance, the left part is a part sandwiched between a part shifted upward by approximately 40° from the leftmost part along the rim 42, and a part shifted downward by approximately 40° from the leftmost part along the rim 42. Similarly, the right part includes a rightmost part in the neutral state. In this instance, the right part is a part sandwiched between a part shifted upward by approximately 40° from the rightmost part along the rim 42, and a part shifted downward by approximately 40° from the rightmost part along the rim 42.

4. Sensor Sheet 74

As shown in FIG. 6, the electrostatic capacitance sensor 56 is formed by a planar sensor sheet 74 including a conductive member made of metal or the like. Within the sensor sheet 74, a center line along the longitudinal direction of the sensor sheet 74 is denoted by C1, and a center line that is parallel to the unfurled, spread out sheet surface and perpendicular to the center line C1 is denoted by C2. The sensor sheet 74 is substantially axisymmetric with respect to the center line C2 which serves as an axis of symmetry.

In this instance, five portions are defined, which are aligned from one side to the other side in the longitudinal direction with respect to the sensor sheet 74. More specifically, a portion extending from the center line C2 toward two end parts 76, 76 is defined as a first portion 80, a portion extending from one of the end parts 76 toward the center line C2 is defined as a second portion 82, a portion extending from another of the end parts 76 toward the center line C2 is defined as a third portion 84, a portion disposed between the first portion 80 and the second portion 82 is defined as a fourth portion 86, and a portion disposed between the first portion 80 and the third portion 84 is defined as a fifth portion 88.

The lengths of the respective portions in the longitudinal direction can be set appropriately according to the positions and the sizes of the spoke non-connected parts 50 and the spoke connected parts 48 of the rim 42. According to the present embodiment, (the length L1 of the first portion 80)≥(the length L2 of the second portion 82+the length L3 of the third portion 84)≥(the length L4 of the fourth portion 86+the length L5 of the fifth portion 88).

The lengths in the width direction (lengths in a direction perpendicular to the longitudinal direction) of the first portion 80, the second portion 82, and the third portion 84 are substantially the same. These lengths correspond to a first width W1. The lengths in the width direction of the fourth portion 86 and the fifth portion 88 are substantially the same. These lengths correspond to a second width W2. On the fourth portion 86 and the fifth portion 88, recesses 90 are formed on both sides in the width direction. Therefore, the second width W2 is narrower than the first width W1.

The sensor sheet 74 is affixed to the surface of the rim resin 54 so that the center line C1 thereof follows along the outer edge portion 72 of the rim resin 54. When the steering wheel 26 is in the neutral state, the first portion 80 is positioned on an upper portion and left and right upper portions of the rim 42, the second portion 82 is positioned on a left lower portion of the rim 42, the third portion 84 is positioned on a right lower portion of the rim 42, the fourth portion 86 is positioned on a left portion of the rim 42, and the fifth portion 88 is positioned on a right portion of the rim 42.

The first portion 80, the second portion 82, and the third portion 84 are positioned on the spoke non-connected parts 50 of the rim 42, the fourth portion 86 is positioned on the left spoke connected part 48L of the rim 42, and the fifth portion 88 is positioned on the right spoke connected part 48R of the rim 42. The two end parts 76, 76 are disposed in facing relation to each other sandwiching the bottom spoke connected part 48B therebetween. Within the rim 42, the region where the sensor sheet 74 is provided forms the sensitive region 100, and regions where the sensor sheet 74 is not provided form the non-sensitive regions 102.

Moreover, in addition to the sensor sheet 74 that forms the electrostatic capacitance sensor 56, the electrostatic capacitance sensor 56 may be formed by coating a conductive member on the surface of the rim resin 54.

5. Operations of the Steering Wheel Unit 12

Figure 7:
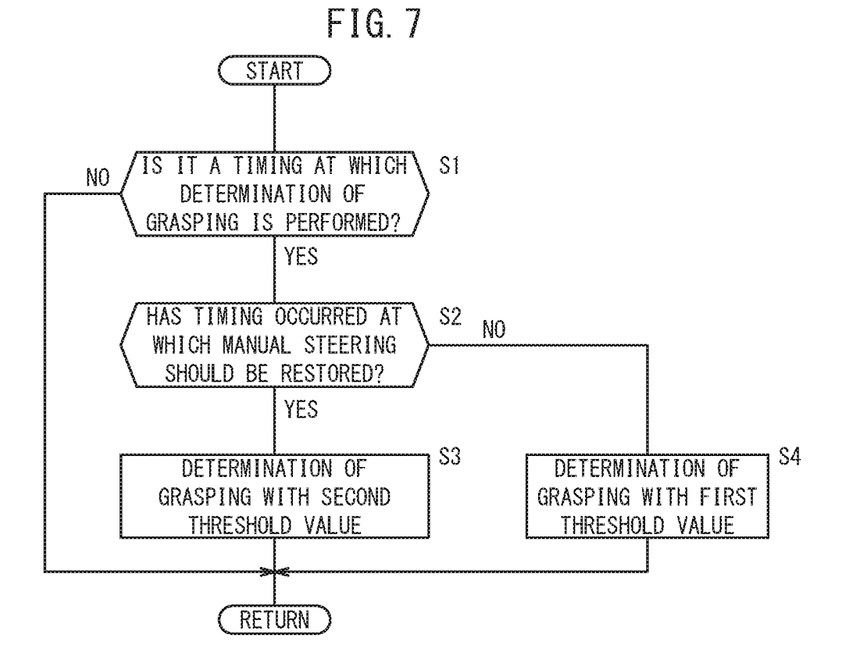
FIG. 7 is a flowchart of processing operations performed by the steering wheel unit.

FIG. 7 is a flowchart of processing operations performed by the steering wheel unit 12. The series of processes described below is repeatedly executed at predetermined time intervals.

In step S1, the comprehensive control unit 36 determines whether or not a timing is occurring at which a determination of grasping (contact determination) is carried out. The timing at which the determination of grasping is performed is arbitrarily set. For example, it is not necessary for the driver to grasp the steering wheel 26 when the vehicle 10 is traveling by way of automated steering. At this time, a determination of grasping need not necessarily be performed. In contrast thereto, when the vehicle 10 is traveling by way of manual steering, it is necessary for the driver to grasp the steering wheel 26. At this time, the determination of grasping may be performed. In the case that a timing occurs at which the determination of grasping is performed (step S1: YES), the process proceeds to step S2. On the other hand, if a timing does not occur at which the determination of grasping is performed (step S1: NO), the series of processes is brought to an end, and it is waited until a subsequent series of processes is started.

In step S2, the comprehensive control unit 36 determines whether or not a timing has occurred at which manual steering should be restored. When the automated driving device 14 determines, during a time of automated steering, that it is necessary to return to the manual steering mode, for example, when the vehicle 10 approaches a terminal position of an automated driving segment, the automated driving device 14 outputs a notification instruction to the notification device 18 in order to prompt the driver to perform manual steering. At this time, the automated driving device 14 outputs a restoration signal to the contact determination device 28 indicating that a timing has arrived to return to the manual steering mode. In the case that the contact determination device 28 receives the restoration signal output from the automated driving device 14, the comprehensive control unit 36 determines that a timing has arrived to return to the manual steering mode, whereas if the restoration signal is not received, the comprehensive control unit 36 determines that such a timing to return to the manual steering mode has not occurred. In the case that a timing occurs to return to the manual steering mode (step S2: YES), the process proceeds to step S3. On the other hand, in the case that a timing to return to the manual steering mode has not occurred (step S2: NO), the process transitions to step S4.

In step S3, the contact detecting unit 38 reads out the second threshold value (which is greater than the first threshold value) from the storage device 34. In addition, by comparing the second threshold value with the detection value C of the electrostatic capacitance sensor 56, it is detected whether or not the driver is grasping the steering wheel 26.

In step S4, the contact detecting unit 38 reads out the first threshold value (which is less than the second threshold value) from the storage device 34. In addition, by comparing the first threshold value with the detection value C of the electrostatic capacitance sensor 56, it is detected whether or not the driver is grasping the steering wheel 26.

In the case that the driver is not grasping the steering wheel 26, the notification instruction unit 40 outputs a notification instruction to the notification device 18 in order to prompt the driver to perform manual steering. Furthermore, in the case that the driver is not grasping the steering wheel 26 despite the elapse of a predetermined time period, the contact detecting unit 38 outputs non-gripping information to the automated driving device 14 indicating that the steering wheel 26 is not being gripped. If the non-gripping information is input, the automated driving device 14 decelerates or stops the vehicle 10 along a roadside shoulder.

6. Summary of the Present Embodiment

6.1 Summary of the Steering Wheel Unit 12

The steering wheel unit 12 is equipped with the electrostatic capacitance sensor 56 which is provided on the steering wheel 26, and is configured to detect a magnitude of the electrostatic capacitance accompanying contact of the human body with respect to the steering wheel 26. On the steering wheel unit 12, the sensitive region 100 configured to detect the contact of the human body with respect to the steering wheel 26 is formed by arranging the electrostatic capacitance sensor 56 on the outer circumferential portion 68 of the rim 42 of the steering wheel 26, and non-sensitive regions 102 that do not detect the contact of the human body with respect to the steering wheel 26 are formed, respectively, on a left portion (left spoke connected part 48L) positioned relatively to the left on the rim 42, and on a right portion (right spoke connected part 48R) positioned in facing relation to the left portion via the center portion O1 in the center of the rim 42 when the steering wheel 26 is in a neutral state.

As in the above-described configuration, when the steering wheel 26 is in a neutral state, assuming that the non-sensitive regions 102 are formed on the left portion (left spoke connected part 48L) positioned relatively to the left on the rim 42, and on the right portion (right spoke connected part 48R) positioned in facing relation to the left portion, even if the arms or elbows of the driver come into contact with the left portion and the right portion of the rim 42, the electrostatic capacitance sensor 56 does not detect a magnitude of the electrostatic capacitance accompanying contact of the human body with respect to the steering wheel 26. Therefore, it is possible to prevent an erroneous detection that the steering wheel 26 is being grasped.

Further, when the steering wheel 26 is in the neutral state, a non-sensitive region 102 also is formed on a bottom portion (bottom spoke connected part 48B) which is positioned relatively low on the rim 42. When the driver restrains the steering wheel 26 with the leg, the leg may be brought into contact with the lower portion of the rim 42. At this time, the electrostatic capacitance sensor 56 detects a magnitude of the electrostatic capacitance accompanying contact of the human body with respect to the steering wheel 26. Upon doing so, even if the driver is not grasping the steering wheel 26, an erroneous detection is made that the steering wheel 26 is being grasped. As in the above-described configuration, when the steering wheel 26 is in the neutral state, assuming that the non-sensitive regions 102 are formed on the lower portion (bottom spoke connected part 48B) positioned relatively low on the rim 42, even if a leg of the driver is placed in contact with the lower portion of the rim 42, the electrostatic capacitance sensor 56 does not detect a magnitude of the electrostatic capacitance accompanying contact of the human body with respect to the steering wheel 26. Therefore, it is possible to prevent an erroneous detection that the steering wheel 26 is being grasped.

The steering wheel unit 12 is equipped with the electrostatic capacitance sensor 56 which is disposed on the steering wheel 26, and detects a magnitude of the electrostatic capacitance accompanying contact of the human body with respect to the steering wheel 26. On the steering wheel unit 12, the sensitive region 100 for detecting contact of the human body with respect to the steering wheel 26 is formed by arranging the electrostatic capacitance sensor 56 on the outer circumferential portion 68 of the rim 42 of the steering wheel 26, and the non-sensitive regions 102 that do not detect contact of the human body with respect to the steering wheel 26 are formed at the connected parts (right spoke connected part 48R and the like, bottom spoke connected part 48B) that connect the rim 42 and the spokes 46 of the steering wheel 26.

When the driver is hunched over the steering wheel 26 due to poor physical condition or the like, there is a tendency for the driver to support his or her own weight by bringing the arms or elbows into contact with portions where the rigidity of the steering wheel 26 is high, and more specifically, the connected parts (the right spoke connected part 48R and the like) between the spokes 46 and the rim 42. As in the above-described configuration, assuming that the non-sensitive regions 102 are formed at portions where the driver is likely to bring his or her arms or elbows into contact with the steering wheel 26, even if the driver is hunched over the steering wheel 26, the electrostatic capacitance sensor 56 does not detect a magnitude of the electrostatic capacitance accompanying contact of the human body with respect to the steering wheel 26. Therefore, it is possible to prevent an erroneous detection that the steering wheel 26 is being grasped.

The electrostatic capacitance sensor 56 is in the form of a sheet, and is affixed to the rim 42. In accordance with the above-described configuration, manufacturing costs are reduced, since the sensitive region 100 and the non-sensitive regions 102 can be formed with respect to the rim 42 with a simple configuration, and by an easy operation of merely affixing the sheet thereon.

In the steering wheel unit 12, the electrostatic capacitance sensor 56 is disposed on the outer edge portion 72 of the rim 42 on which the non-sensitive regions 102 are formed. As in the above-described configuration, assuming that the electrostatic capacitance sensor 56 is arranged on the outer edge portion 72 of the rim 42 on which the non-sensitive regions 102 are formed, by the driver properly grasping the rim 42, it is possible to detect that the steering wheel 26 is being grasped. In this manner, it is possible to correctly detect a grasped state of the steering wheel 26.

The steering wheel unit 12 is provided in the vehicle 10 which is configured to be switched between a manual steering mode and an automated steering mode. The steering wheel unit 12 is equipped with the contact detecting unit 38 configured to detect whether or not the human body is in contact with the steering wheel 26 in accordance with the magnitude of the electrostatic capacitance detected by the electrostatic capacitance sensor 56. At a time of the manual steering mode, the contact detecting unit 38 is configured to detect whether or not the human body is in contact with the steering wheel 26, on the basis of whether or not the magnitude of the electrostatic capacitance detected by the electrostatic capacitance sensor 56 is greater than or equal to a first threshold value. At a time of returning from the automated steering mode to the manual steering mode, the contact detecting unit 38 is configured to set the second threshold value which is greater than the first threshold value, and detect whether or not the human body is in contact with the steering wheel 26, on the basis of whether or not the magnitude of the electrostatic capacitance detected by the electrostatic capacitance sensor 56 is greater than or equal to the second threshold value. In the vehicle 10 which is capable of switching between a manual steering mode and an automated steering mode, at a time of returning from the automated steering mode to the manual steering mode, a request is made to the driver to grasp the steering wheel 26. As in the above described configuration, at a time of returning from the automated steering mode to the manual steering mode, if it is detected whether or not the human body is in contact with the steering wheel 26 by way of a comparison with the second threshold value which is greater than the first threshold value, the accuracy in recognizing such grasping is improved.

6.2 Summary of the Steering Wheel 26

The steering wheel 26 includes the rim 42 and the spokes 46. The rim 42 is made up from a plurality of spoke connected parts 48 connected to the spokes 46, and spoke non-connected parts 50 interposed between mutually adjacent ones of the spoke connected parts 48, and which are not connected to the spokes 46. The electrostatic capacitance sensor 56 is disposed on the outer circumferential portion 68 of the rim 42, along the cross-sectional circumferential direction of the rim 42. The second width W2 in the cross-sectional circumferential direction of the electrostatic capacitance sensor 56 disposed at the spoke connected parts 48 is narrower than the first width W1 in the cross-sectional circumferential direction of the electrostatic capacitance sensor 56 disposed at the spoke non-connected parts 50.

As in the above-described configuration, assuming that the second width W2 of the electrostatic capacitance sensor 56, which is disposed at the spoke connected parts 48 where there is a high possibility that the driver will bring the arms or elbows into contact therewith, is narrower than the first width W1 of the electrostatic capacitance sensor 56 disposed at other portions, even if the driver is hunched over the steering wheel 26, the electrostatic capacitance sensor 56 does not detect an electrostatic capacitance accompanying contact of the human body with respect to the steering wheel 26. Therefore, it is possible to prevent an erroneous detection that the steering wheel 26 is being grasped.

6.3 Summary of the Sensor Sheet 74

The sensor sheet 74 is made up from the first portion 80 extending from the center toward the two end parts 76, 76 in a longitudinal direction of the sheet, the second portion 82 extending from one of the end parts 76 toward the center, the third portion 84 extending from the other of the end parts 76 toward the center, the fourth portion 86 disposed between the first portion 80 and the second portion 82, and the fifth portion 88 disposed between the first portion 80 and the third portion 84, wherein the first portion 80, the second portion 82, and the third portion 84 have a first width W1 in a lateral direction of the sheet, and the fourth portion 86 and the fifth portion 88 have a second width W2 in the lateral direction of the sheet. The second width W2 is narrower than the first width W1.

In accordance with the above-described configuration, manufacturing costs are reduced, since the sensitive region 100 and the non-sensitive regions 102 can be formed with respect to the rim 42 with a simple configuration, and by an easy operation of merely affixing the sensor sheet 74 thereon.

The present invention is not particularly limited to the embodiment described above, and various modifications are possible without departing from the essence and gist of the present invention.

What is claimed is:

1. A steering wheel unit configured to detect by a sensor contact of a human body with respect to a steering wheel of a vehicle, comprising:
    an electrostatic capacitance sensor provided on the steering wheel and configured to detect a magnitude of an electrostatic capacitance accompanying contact of the human body with respect to the steering wheel,
    wherein, on the steering wheel unit, a sensitive region configured to detect the contact of the human body with respect to the steering wheel is formed by arranging the electrostatic capacitance sensor on an outer circumferential portion of a rim of the steering wheel along a cross-sectional circumferential direction of the rim;
    non-sensitive regions that do not detect the contact of the human body with respect to the steering wheel are formed, respectively, on a left portion positioned relatively to left on the rim, and on a right portion positioned in facing relation to the left portion via a center portion of the rim when the steering wheel is in a neutral state; and
    a width in the cross-sectional circumferential direction of the electrostatic capacitance sensor is narrower in the rim in the non-sensitive regions than in the rim in the sensitive region.

2. The steering wheel unit according to claim 1, wherein the non-sensitive regions are further formed in a lower portion positioned relatively low on the rim when the steering wheel is in the neutral state.

3. The steering wheel unit according to claim 1, wherein the non-sensitive regions are formed at connected parts between spokes of the steering wheel and the rim.

4. The steering wheel unit according to claim 3, wherein:
    the rim comprises a plurality of spoke connected parts connected to the spokes, and spoke non-connected parts interposed between mutually adjacent ones of the spoke connected parts, and which are not connected to the spokes;

an electrostatic capacitance sensor is disposed on an outer circumferential portion of the rim along a cross-sectional circumferential direction of the rim; and a width in the cross-sectional circumferential direction of the electrostatic capacitance sensor disposed at the spoke connected parts is narrower than a width in the cross-sectional circumferential direction of the electrostatic capacitance sensor disposed at the spoke nonconnected parts.

5. The steering wheel unit according to claim 1, wherein the electrostatic capacitance sensor is in form of a sheet, and is affixed to the rim.

6. The steering wheel unit according to claim 5, the electrostatic capacitance sensor comprising:
   a first portion extending from a center toward two end parts in a longitudinal direction of the sheet;
   a second portion extending from one of the end parts toward the center;
   a third portion extending from another of the end parts toward the center;
   a fourth portion disposed between the first portion and the second portion; and
   a fifth portion disposed between the first portion and the third portion;
   wherein the first portion, the second portion, and the third portion have a first width in a lateral direction of the sheet;
   the fourth portion and the fifth portion have a second width in the lateral direction of the sheet; and
   the second width is narrower than the first width.

7. The steering wheel unit according to claim 1, wherein the electrostatic capacitance sensor is disposed on an outer edge portion of the rim on which the non-sensitive regions are formed.

8. The steering wheel unit according to claim 1, wherein the vehicle is configured to switch between a manual steering mode and an automated steering mode, the steering wheel unit further comprising:
   a contact detecting unit configured to detect whether or not the human body is in contact with the steering wheel in accordance with the magnitude of the electrostatic capacitance detected by the electrostatic capacitance sensor;
   wherein the contact detecting unit is configured to:
   at a time of the manual steering mode, detect whether or not the human body is in contact with the steering wheel based on whether or not the magnitude of the electrostatic capacitance detected by the electrostatic capacitance sensor is greater than or equal to a first threshold value; and
   at a time of returning from the automated steering mode to the manual steering mode, set a second threshold value which is greater than the first threshold value, and detect whether or not the human body is in contact with the steering wheel based on whether or not the magnitude of the electrostatic capacitance detected by the electrostatic capacitance sensor is greater than or equal to the second threshold value.

* * * * *